(12) United States Patent
Kao et al.

(10) Patent No.: US 11,658,207 B2
(45) Date of Patent: May 23, 2023

(54) CAPACITOR AND ELECTRONIC DEVICE

(71) Applicant: Innolux Corporation, Miao-Li County (TW)

(72) Inventors: Ker-Yih Kao, Miao-Li County (TW); Ming Chun Tseng, Miao-Li County (TW); Liang-Lu Chen, Miao-Li County (TW)

(73) Assignee: Innolux Corporation, Miaoli County (TW)

(*) Notice: Subject to any disclaimer, the term of this patent is extended or adjusted under 35 U.S.C. 154(b) by 10 days.

(21) Appl. No.: 17/199,296

(22) Filed: Mar. 11, 2021

(65) Prior Publication Data

US 2021/0305359 A1    Sep. 30, 2021

Related U.S. Application Data

(60) Provisional application No. 62/994,861, filed on Mar. 26, 2020.

(30) Foreign Application Priority Data

Dec. 8, 2020  (CN) .......................... 202011424401.1

(51) Int. Cl.
| | | |
|---|---|---|
| *H01L 27/14* | (2006.01) | |
| *H01L 49/02* | (2006.01) | |
| *H01L 27/12* | (2006.01) | |
| *H01G 4/33* | (2006.01) | |

(52) U.S. Cl.
CPC ............... *H01L 28/90* (2013.01); *H01G 4/33* (2013.01); *H01L 27/1255* (2013.01)

(58) Field of Classification Search
CPC ........ H01L 28/90; H01L 27/1255; H01G 4/33

USPC ....................................................... 257/59, 72
See application file for complete search history.

(56) References Cited

U.S. PATENT DOCUMENTS

| | | | |
|---|---|---|---|
| 6,262,783 B1 | 7/2001 | Tsuda et al. | |
| 6,765,230 B2 | 7/2004 | Murade | |
| 6,825,891 B2 | 11/2004 | Kurashina | |
| 9,431,544 B2 * | 8/2016 | Gao ................... | H01L 21/32139 |

(Continued)

FOREIGN PATENT DOCUMENTS

| | | | |
|---|---|---|---|
| CN | 101123854 A | * | 2/2008 |
| CN | 104134674 | | 11/2014 |

(Continued)

OTHER PUBLICATIONS

"Office Action of China Counterpart Application", dated Dec. 16, 2022, p. 1-p. 9.

*Primary Examiner* — Tan N Tran
(74) *Attorney, Agent, or Firm* — JCIPRNET

(57) ABSTRACT

The disclosure provides a capacitor and an electronic device. The capacitor is disposed on a substrate with a protrusion. The capacitor includes a first electrode, a second electrode, and an insulating layer. The first electrode has a first voltage. The second electrode has a second voltage different from the first voltage. The second electrode is closer to the substrate than the first electrode. The insulating layer is disposed between the first electrode and the second electrode. The protrusion penetrates the second electrode and extends into the insulating layer. The electronic device includes the capacitor. The capacitor and the electronic device of the embodiments in the disclosure have a better yield.

19 Claims, 11 Drawing Sheets

(56) References Cited

U.S. PATENT DOCUMENTS

2011/0096281 A1  4/2011  Ting et al.
2020/0411622 A1* 12/2020  Sun ..................... H01L 27/3258

FOREIGN PATENT DOCUMENTS

CN      110265412      9/2019
JP      2012119426 A  *  6/2012

* cited by examiner

CAPACITOR AND ELECTRONIC DEVICE

CROSS-REFERENCE TO RELATED APPLICATION

This application claims the priority benefit of U.S. provisional application Ser. No. 62/994,861, filed on Mar. 26, 2020, and China application serial no. 202011424401.1, filed on Dec. 8, 2020. The entirety of each of the above-mentioned patent applications is hereby incorporated by reference herein and made a part of this specification.

BACKGROUND

Technical Field

The disclosure relates to a capacitor and an electronic device, and more particularly, to a capacitor disposed on a substrate with a protrusion.

Description of Related Art

Display panels have been widely applied in electronic devices such as mobile phones, televisions, monitors, tablet computers, car displays, wearable devices, and desktop computers. With the vigorous development of electronic products, the requirements for the display quality of electronic products are getting higher and higher so that the electronic devices adapted for display are continuously improving towards larger or higher resolution display.

SUMMARY

The disclosure provides a capacitor and an electronic device including the capacitor.

According to the embodiments of the disclosure, the capacitor is disposed on a substrate with a protrusion. The capacitor includes a first electrode, a second electrode, and an insulating layer. The first electrode has a first voltage. The second electrode has a second voltage different from the first voltage. The second electrode is closer to the substrate than the first electrode. The insulating layer is disposed between the first electrode and the second electrode. The protrusion penetrates the second electrode and extends into the insulating layer.

According to the embodiments of the disclosure, the electronic device includes the capacitor.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
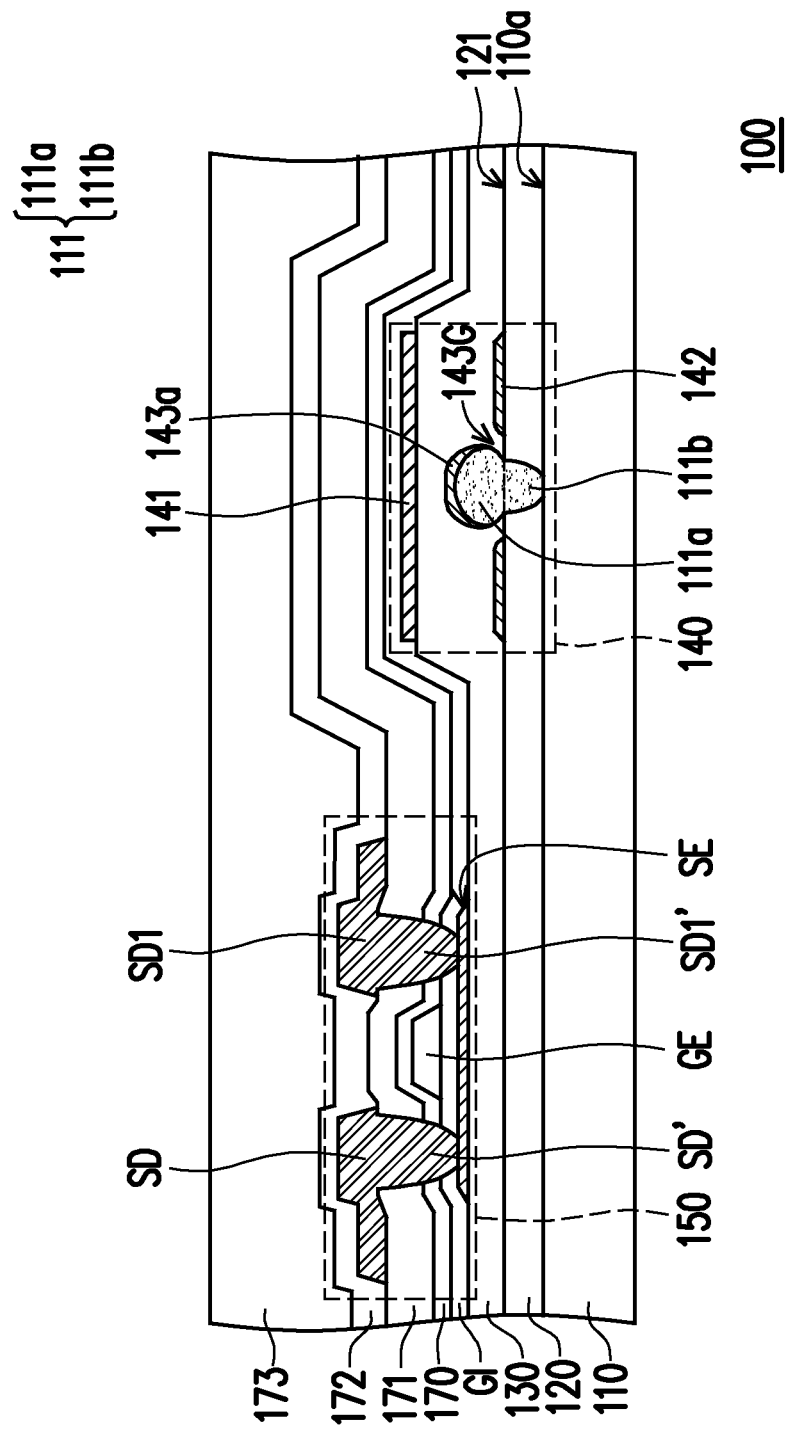
FIG. 1 is a schematic cross-sectional view of an electronic device according to an embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific elements in the drawings are not necessarily drawn to scale. Moreover, the quantity and the size of each element in the drawings are only schematic and are not intended to limit the scope of the disclosure. For example, material, thickness, and contour of film layers, structure of transistors, layout of circuits, etc. are simply exemplary; size or range is simply exemplary; and the disclosure is not limited thereto.

In the following specification and claims, the terms "including", "containing", "having", etc., are open-ended terms, so they should be interpreted to mean "including but not limited to . . . ".

It should be understood that when an element or layer is referred to as being "on" or "connected to" another element or layer, it can be directly set on the another element or layer or directly connected to the another element or layer, or there is an intervening element or layer between the two (indirect connection). In contrast, when an element is referred to as being "directly on" or "directly connected to" another element or layer, there are no intervening elements or layers between the two.

Although the terms first, second, third . . . can be used to describe a variety of elements, the elements are not limited by this term. This term is only used to distinguish a single element from other elements in the specification. Different terminologies may be adopted in claims, and replaced with the first, second, third . . . in accordance with the order of elements specified in the claims. Therefore, in the following description, the first element may be described as the second element in the claims.

In the description, the terms such as "about", "equal", "same", "substantially", or "approximately" are generally interpreted as being within a range of plus or minus 10% of a given value or range, or as being within a range of plus or minus 5%, plus or minus 3%, plus or minus 2%, plus or minus 1%, or plus or minus 0.5% of the given value or range. The quantity given here is an approximate quantity, that is, in the absence of a specific description of "about", "equal", "substantially" or "approximately", the quantity given here still implies the meaning of "about", "equal", "substantially" and "approximately". In addition, the terms "the scope between the first value and the second value" and "the scope ranging from the first value to the second value" mean that the range includes the first value, the second value, and other values in between.

In some embodiments of the disclosure, terms such as "connect" and "interconnect" with respect to bonding and connection, unless specifically defined, may refer to two structures that are in direct contact with each other, or may refer to two structures that are indirectly in contact with each other, wherein there are other structures set between these two structures. In addition, the terms that describe joining and connecting may apply to the case where both structures are movable or both structures are fixed. In addition, the term "coupling" involves any direct and indirect electrical connection means.

In the disclosure, the length or width may be measured by an optical microscope, and the thickness may be measured according to a cross-sectional image in an electron microscope, but the disclosure is not limited thereto. In addition, there may be a certain error between any two values or directions used for comparison.

The electronic device in the disclosure may include a display device, an antenna device, a sensing device, a touch display device, a curved display device, or a free shape display device, but the disclosure is not limited thereto. The electronic device may be a bendable or flexible electronic device. The electronic device may, for example, include light-emitting diodes (LEDs), liquid crystals, fluorescence, phosphor, or quantum dots (QDs), other suitable display media, or a combination thereof, but the disclosure is not limited thereto. The light-emitting diodes may include, for example, organic light-emitting diodes (OLEDs), inorganic light-emitting diodes, mini LEDs, micro LEDs or quantum dot light-emitting diodes (QLEDs, QDLEDs), other suitable materials, or a combination thereof, but the disclosure is not limited thereto. The chip size of light-emitting diodes ranges from 300 microns to 10 mm, the chip size of mini LEDs ranges from 100 microns to 300 microns, and the chip size of micro LEDs ranges from 1 micron to 100 microns, but the disclosure is not limited thereto. In addition, the display device may include, for example, a splicing display device, but the disclosure is not limited thereto. The antenna device may be, for example, a liquid crystal antenna, but the disclosure is not limited thereto. The antenna device may include, for example, an antenna splicing device, but the disclosure is not limited thereto. Note that the electronic device may be a combination thereof, but the disclosure is not limited thereto. Moreover, the electronic device may be in a rectangular shape, a circular shape, a polygonal shape, a shape with curved edges, or other suitable shapes. The electronic device may have peripheral systems such as a driving system, a control system, a light source system, a shelf system, etc. to support the display device, the antenna device, or the splicing device. The content of the disclosure is described by using the electronic device, but the disclosure is not limited thereto.

In the disclosure, the features of multiple embodiments to be described below may be replaced, recombined, or mixed to form other embodiments without departing from the spirit of the disclosure. The features of multiple embodiments may be used in combination as long as such combination does not depart from the spirit of the disclosure or lead to conflict.

Reference will now be made in detail to the exemplary embodiments of the disclosure, examples of which are illustrated in the accompanying drawings. Whenever possible, the same reference numerals are used to represent the same or similar parts in the accompanying drawings and description.

FIG. 1 is a schematic cross-sectional view of an electronic device according to an embodiment of the disclosure. FIG. 2A to FIG. 2H are schematic cross-sectional views of the manufacturing method of the electronic device of FIG. 1. FIG. 2I is a schematic three-dimensional view of the electronic device of FIG. 2H. FIG. 2J is a schematic view of the orthographic projection of the capacitor in the normal direction of the substrate in FIG. 2H. For clarity of the drawings and convenience of description, several elements in the electronic device are omitted in FIG. 2A to FIG. 2H.

Referring to FIG. 1, an electronic device 100 in the embodiment includes a substrate 110, a film layer 120, an insulating layer 130, a capacitor 140, and a transistor 150. The substrate 110 has a protrusion 111. In detail, the protrusion 111 can be located on an upper surface 110a of the substrate 110. In the embodiment, the substrate 110 may include a flexible substrate, a rigid substrate, or a combination thereof. For example, the material of the substrate 110 may include polycarbonate (PC), polyimide (PI), polyethylene terephthalate (PET), glass, other suitable substrate materials, or a combination thereof, but the disclosure is not limited thereto. In the embodiment, the material of the protrusion 111 may include metal, other materials with conductive properties, or a combination thereof, but the disclosure is not limited thereto. In some embodiments, the protrusion 111 may also be a material with no conductive properties.

In the embodiment, the film layer 120 is disposed on the upper surface 110a of the substrate 110 and the extension portion 111a of the protrusion 111 is exposed. That is, the protrusion 111 located on the upper surface 110a of the substrate 110 passes and penetrates a surface 121 of the film layer 120, so that the extension portion 111a of the protrusion 111 is exposed outside the film layer 120. The surface 121 of the film layer 120 is a surface away from the substrate 110. The insulating layer 130 is disposed on the film layer 120 and covers the extension portion 111a of the protrusion 111, and the extension portion 111a is exposed by the film layer 120.

As shown in FIG. 1, the capacitor 140 and the transistor 150 are disposed on the substrate 110 with the protrusion 111. The capacitor 140 is adapted to stabilize the voltage difference so that the voltage level is stable and not easily changed. The capacitor 140 includes a first electrode 141, a second electrode 142, and a part of the insulating layer 130. The first electrode 141 includes a first voltage. The second electrode 142 includes a second voltage different from the first voltage. The second electrode 142 is closer to the substrate 110 than the first electrode 141. The insulating layer 130 is disposed between the first electrode 141 and the second electrode 142. The capacitor 140 and the substrate 110 are respectively located on opposite sides of the film layer 120. The protrusion 111 penetrates the second electrode 142 and extends into the insulating layer 130. The protrusion 111 penetrates the second electrode 142, and a gap 143G is formed between the protrusion 111 and the second electrode 142. The part of the protrusion 111 extending into the insulating layer 130 is referred to as an extension portion 111a. Therefore, the extension portion 111a of the protrusion 111 extends into the insulating layer 130 and is electrically separated from the second electrode 142.

Next, refer to FIG. 1, FIG. 2A to FIG. 2H, and FIG. 2I altogether. The manufacturing method of the capacitor 140 in the electronic device 100 in the embodiment is illustrated below.

Figure 2A:
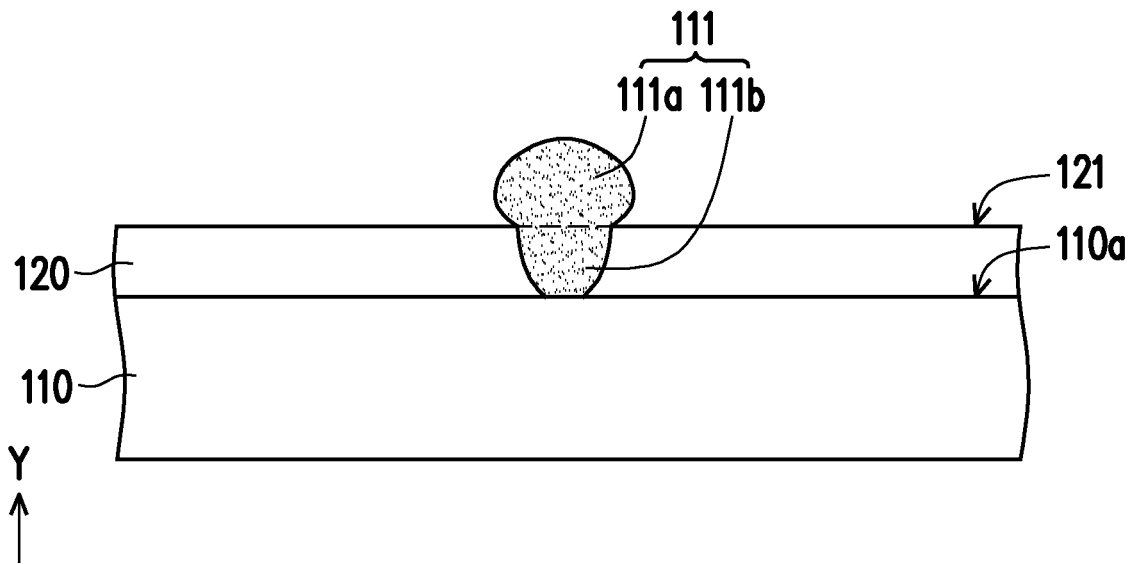
FIG. 2A to FIG. 2H are schematic cross-sectional views of the manufacturing method of the electronic device of FIG. 1.

First, referring to FIG. 1 and FIG. 2A, the film layer 120 is formed on the substrate 110 with the protrusion 111 so that the film layer 120 covers the upper surface 110a of the substrate 110 and the extension portion 111a of the protrusion 111 is exposed. The height of the protrusion 111 can range from 1 μm to 2 μm, but the disclosure is not limited thereto. The contour of the extension portion 111a of the protrusion 111 may be arc-shaped or does not have an acute angle, but the disclosure is not limited thereto. Another part 111b of the protrusion 111 penetrates the film layer 120 and contacts the upper surface 110a of the substrate 110. In the embodiment, the film layer 120 may be a single-layer or multi-layer insulating layer, and may include organic materials, inorganic materials, or a combination thereof, but the disclosure is not limited thereto.

Figure 2B:
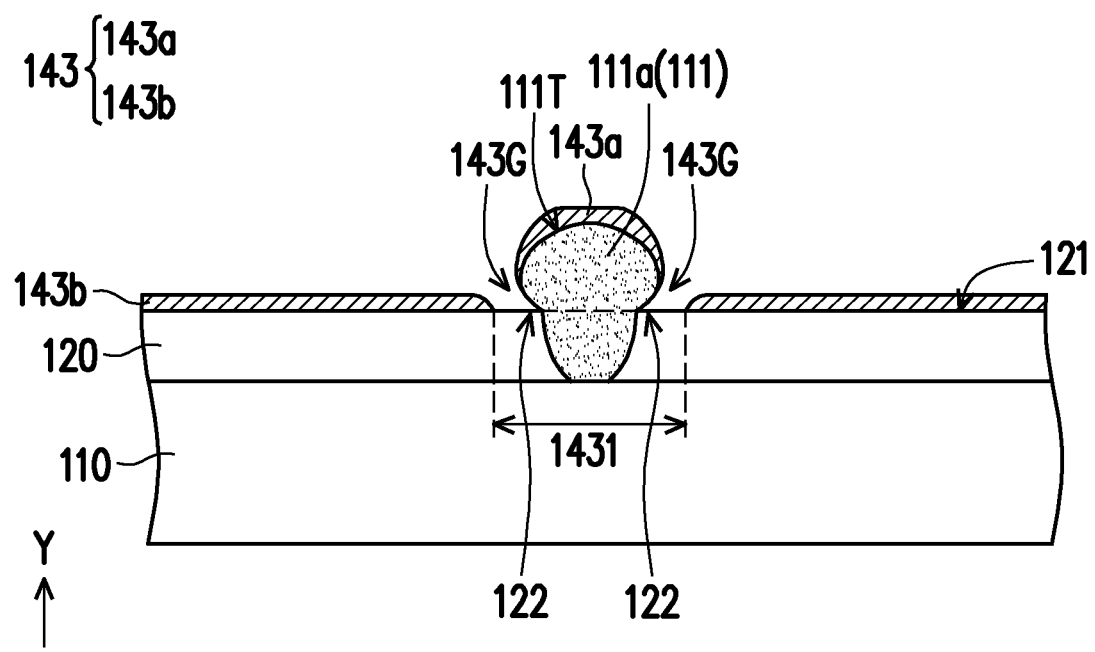

Next, referring to FIG. 1 and FIG. 2B, an electrode material layer 143 is formed on the surface 121 of the film layer 120 and on the extension portion 111a of the protrusion 111. The electrode material layer 143 may include transparent conductive materials or non-transparent conductive materials, such as indium tin oxide, indium zinc oxide, indium oxide, zinc oxide, tin oxide, metal materials (e.g., aluminum, molybdenum, copper, silver, etc.), other suitable materials or a combination thereof, but the disclosure is not limited thereto. In the embodiment, when the electrode material layer 143 is formed, since the contour of the extension portion 111a of the protrusion 111 is arc-shaped or does not have an acute angle, a part 122 of the film layer 120 is shielded and the electrode material layer 143 is prevented from being deposited on the part 122 of the film layer 120, which further causes the deposited electrode material layer 143 to be a discontinuous film layer and have the gap 143G. In detail, the gap 143G divides the electrode material layer 143 into a residual electrode portion 143a and a main electrode portion 143b. The residual electrode portion 143a is disposed on a top portion 111T of the protrusion 111, that is, on the top portion 111T of the extension portion 111a. The main electrode portion 143b is disposed on the surface 121 of the film layer 120 and served as the second electrode 142 of the capacitor 140 through a subsequent lithography process and an etching process. The main electrode portion 143b is physically and electrically separated from the extension portion 111a of the protrusion 111 through the gap 143G of the electrode material layer 143. The part 122 of the film layer 120 exposed by the gap 143G is referred to as an exposed portion.

The residual electrode portion 143a is physically and electrically separated from the main electrode portion 143b through the gap 143G. That is, the main electrode portion 143b is served as the second electrode 142 of the capacitor 140 through the subsequent lithography process and the etching process. The residual electrode portion 143a is electrically separated from the main electrode portion 143b and is not served as the second electrode 142. Therefore, the second electrode 142 formed subsequently has an opening 1431, and the protrusion 111 is disposed in the opening 1431.

Figure 2C:
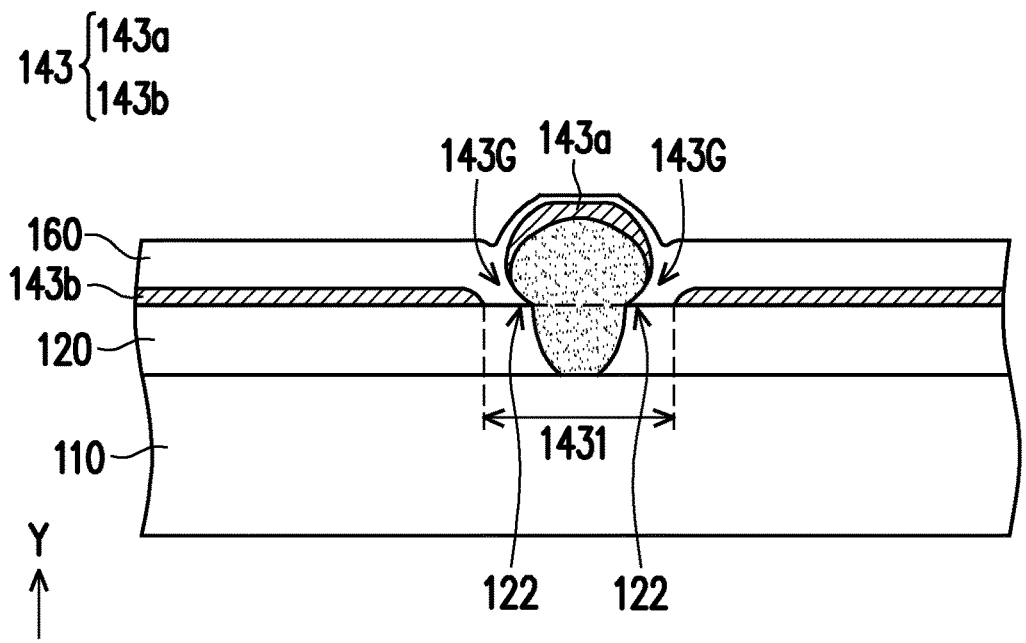

Furthermore, referring to FIG. 1 and FIG. 2C, a photoresist layer 160 is formed on the electrode material layer 143 so that the photoresist layer 160 covers the residual electrode portion 143a of the electrode material layer 143, the main electrode portion 143b, and the part 122 of the film layer 120, and is filled in the gap 143G of the electrode material layer 143. The thickness of the photoresist layer 160 covering the residual electrode portion 143a can be less than the thickness of the photoresist layer 160 covering the main electrode portion 143b, but the disclosure is not limited thereto.

Figure 2D:
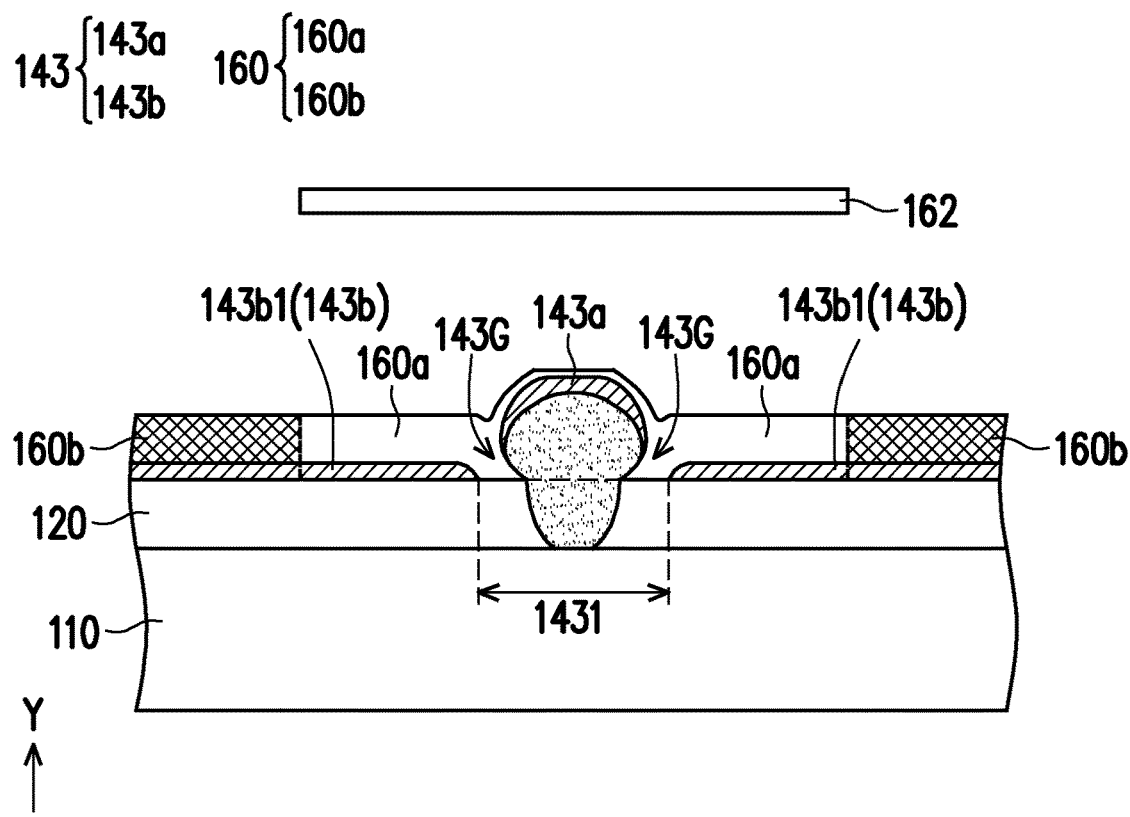

Then, referring to FIG. 1 and FIG. 2D, after a photomask 162 is disposed to shield the photoresist layer 160 (i.e., a photoresist layer 160a) on the residual electrode portion 143a of the electrode material layer 143 and a part 143b1 of the main electrode portion 143b, an exposure process (e.g., ultraviolet light is used for irradiation, but the disclosure is not limited thereto) is performed on the photoresist layer 160 so that the photoresist layer 160 (i.e., a photoresist layer 160b) not shielded by the photomask 162 is denatured.

Figure 2E:
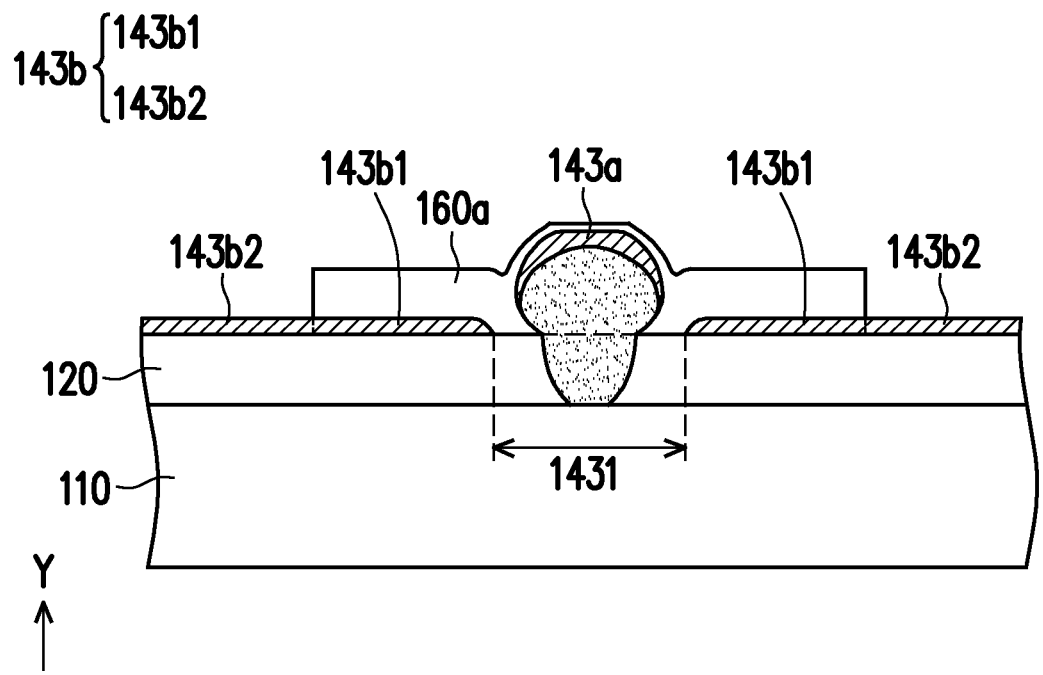

Then, referring to FIG. 1 and FIG. 2E, a developing process is performed on the photoresist layers 160a and 160b to remove the denatured photoresist layer 160b, and another part 143b2 of the main electrode portion 143b of the electrode material layer 143 is exposed.

Figure 2F:
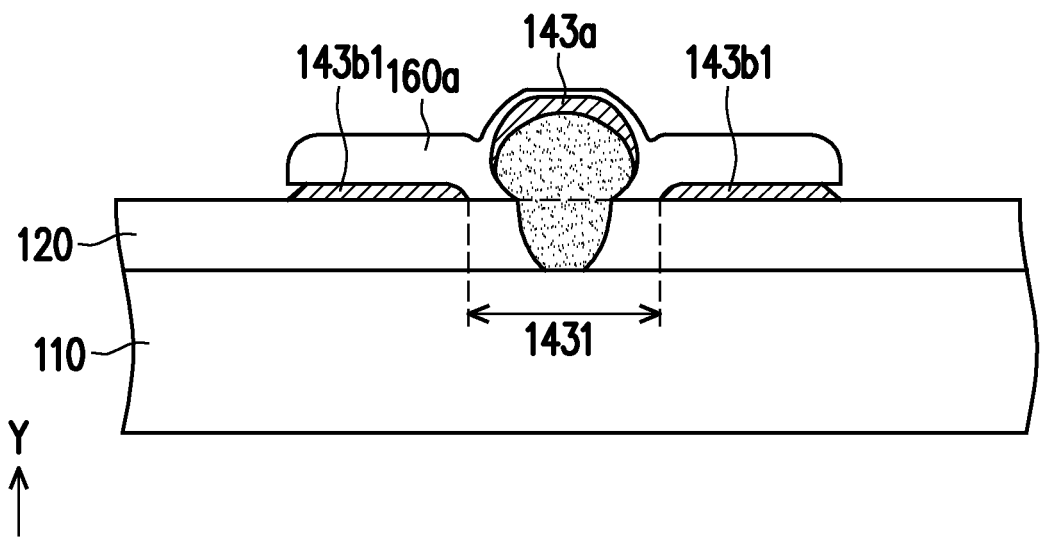

Next, referring to FIG. 1 and FIG. 2F, the etching process is performed to remove another part 143b2 of the main electrode portion 143b of the electrode material layer 143 exposed by the photoresist layer 160a.

Figure 2G:
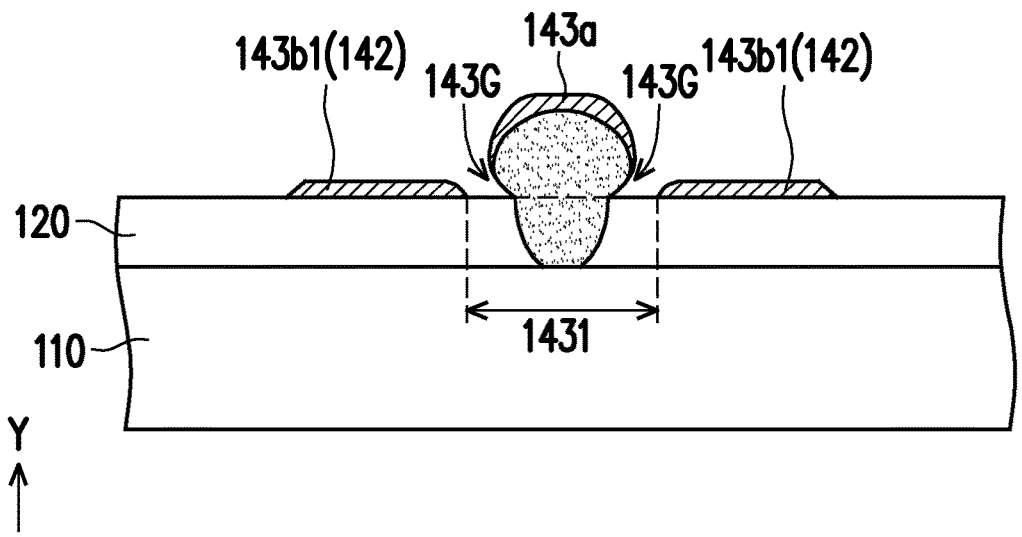

Then, referring to FIG. 1 and FIG. 2G, the photoresist layer 160a is removed; and the residual electrode portion 143a of the electrode material layer 143, the part 143b1 of the main electrode portion 143b, and the gap 143G are exposed to form the second electrode 142. The second electrode 142 includes the part 143b1 of the main electrode portion 143b of the electrode material layer 143.

Figure 2H:
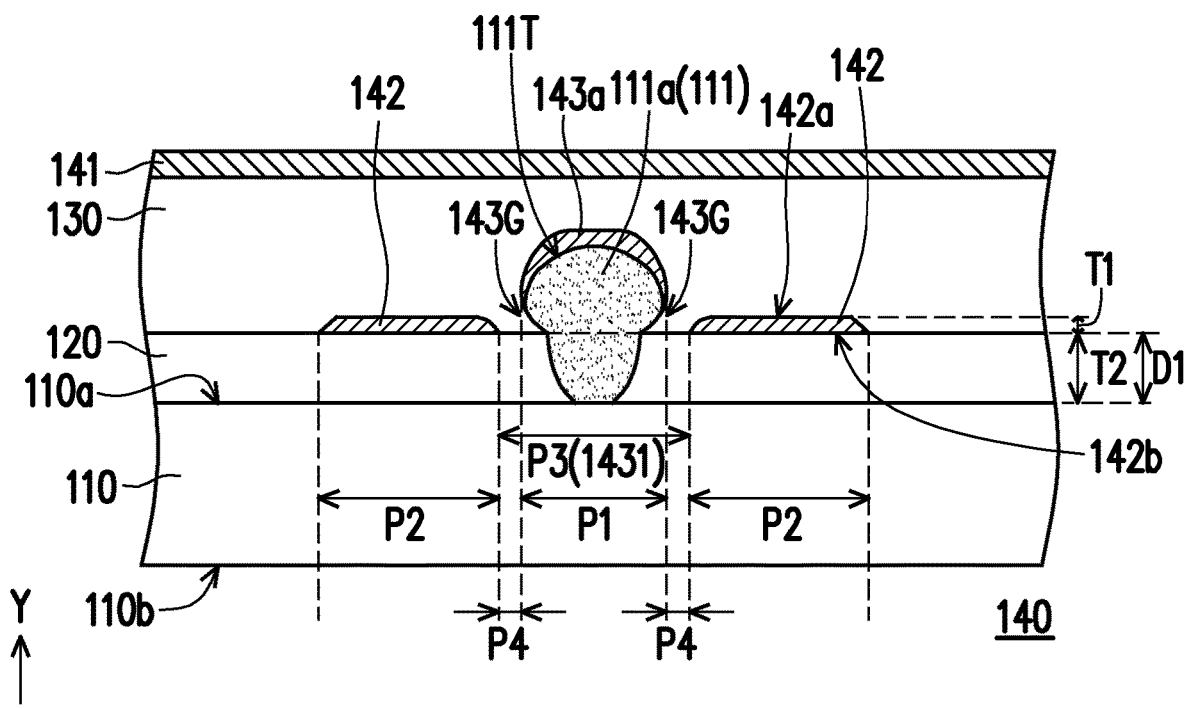
Figure 2I:
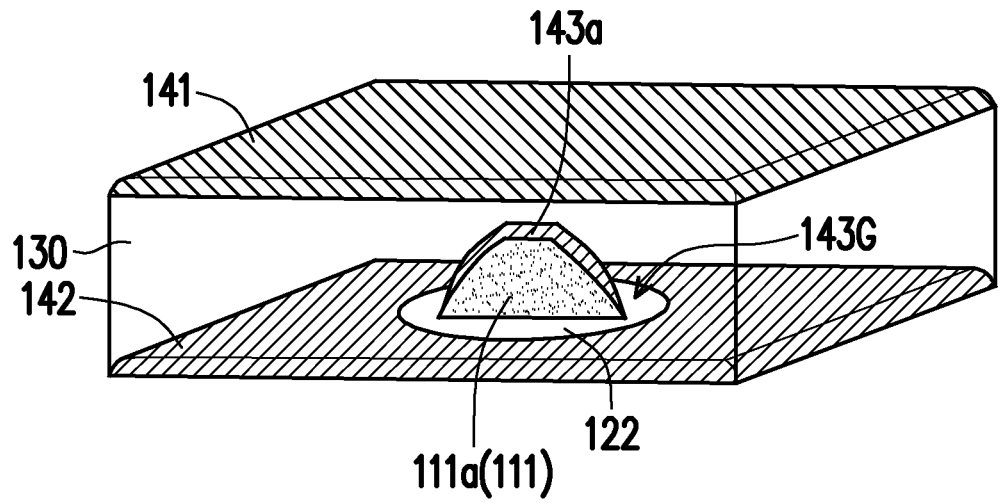
FIG. 2I is a schematic three-dimensional view of the electronic device of FIG. 2H.
Figure 2J:
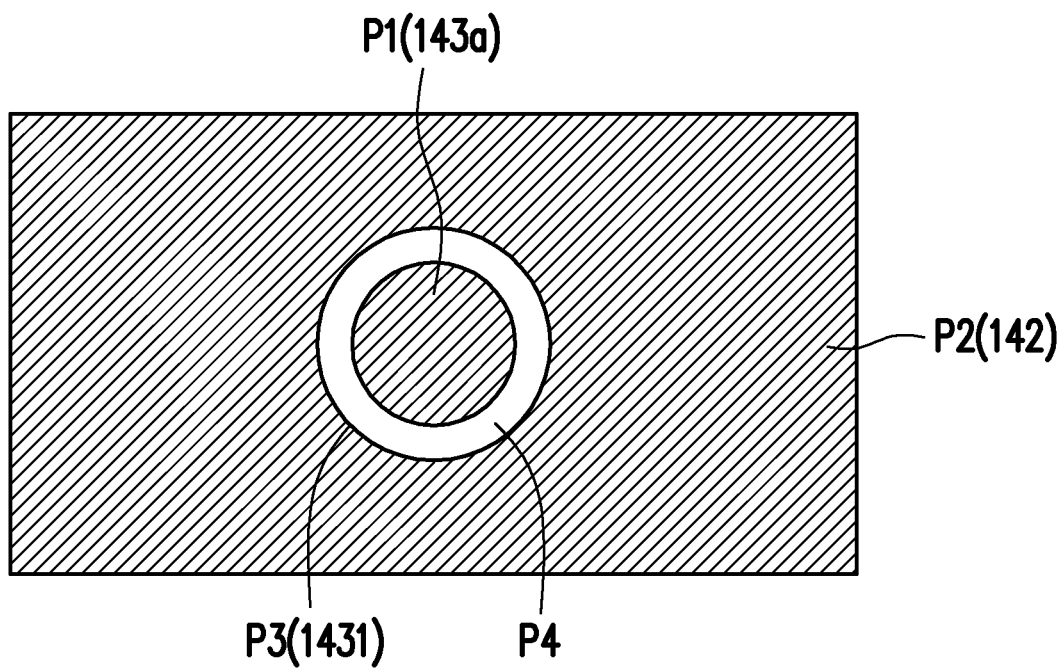
FIG. 2J is a schematic view of the orthographic projection of the capacitor in the normal direction of the substrate in FIG. 2H.

Finally, referring to FIG. 1, FIG. 2H, and FIG. 2I, the insulating layer 130 is first formed on the top surface 142a of the second electrode 142 so that the insulating layer 130 covers the film layer 120 and the second electrode 142, and the insulating layer 130 is filled into the gap 143G. In the embodiment, the insulating layer 130 may have a single-layer or multi-layer structure and, for example, may include organic materials, inorganic materials (e.g., nitrides, oxides, but the disclosure is not limited thereto), or a combination thereof, but the disclosure is not limited thereto. Next, the first electrode 141 is formed on the insulating layer 130 to complete the capacitor 140 in the embodiment. As shown in FIG. 2H, in the capacitor 140, the residual electrode portion 143a is disposed on the top portion 111T of the protrusion 111, and the residual electrode portion 143a and the second electrode 142 can be made of the same material, and can be made by the same process. The gap 143G is disposed between the extension portion 111a of the protrusion 111 and the second electrode 142, and the insulating layer 130 is filled in the gap 143G. The extension portion 111a of the protrusion 111 is electrically separated from the second electrode 142 by the gap 143G of the electrode material layer 143. Accordingly, according to some embodiments, when the protrusion 111 is conductive, the conductive protrusion 111 and the second electrode 142 are prevented from being short-circuited and causing the capacitor 140 to fail.

According to some embodiments, the orthographic projection of the residual electrode portion 143a in a normal direction Y on the substrate 110 at least partially overlaps the orthographic projection of the opening 1431 in the normal direction Y on the substrate 110. FIG. 2J shows the orthographic projection of the capacitor 140 in the normal direction Y on the substrate 110. For example, according to some embodiments, as shown in FIG. 2H and FIG. 2J, the orthographic projection of the residual electrode portion 143a in the normal direction Y on the substrate 110 is P1, the orthographic projection of the second electrode 142 in the normal direction Y on the substrate 110 is P2, and the orthographic projection of the opening 1431 of the second electrode 142 in the normal direction Y on the substrate 110 is P3. The orthographic projection P1 of the residual electrode portion 143a in the normal direction Y on the substrate 110 may be completely within the scope of the orthographic projection P3 of the opening 1431 in the normal direction Y on the substrate 110, and the area of the orthographic projection P1 may be less than the area of the orthographic projection P3. Therefore, from the orthographic projection on the substrate 110, an annular interval projection P4 can be seen. The annular interval projection P4 can surround the orthographic projection P1 of the residual electrode portion 143a and is disposed between the orthographic projection P1 of the residual electrode portion 143a and the orthographic projection P2 of the second electrode 142.

According to some embodiments, to verify whether a product has the capacitor 140 disclosed in the disclosure, it may be learned from the pattern of the second electrode 142 in the capacitor 140. Specifically, for example, as shown in FIG. 2H and FIG. 2J, an electron microscope or an X-ray analyzer is adapted to observe the position of the capacitor 140 in the normal direction Y from a lower surface 110b of the substrate 110. When the residual electrode portion 143a and the second electrode 142 are made of the same material, if it is observed that the second electrode 142 of the capacitor 140 has an annular interval in the relative position, it is learned that the annular interval is the annular interval projection P4 between the orthographic projection P1 of the residual electrode portion 143a and the second electrode 142. That is, it can be proved that the product has the characteristics of the capacitor in accordance with the disclosure.

Moreover, according to some embodiments, the orthographic projection of the extension portion 111a of the protrusion 111 in the normal direction Y on the substrate 110 can at least partially overlap the orthographic projection of the opening 1431 in the normal direction Y on the substrate 110.

Furthermore, referring to FIG. 2H, in some embodiments, a distance D1 between a bottom surface 142b of the second electrode 142 and the upper surface 110a of the substrate 110 can be not less than 1500 angstroms and not greater than 7000 angstroms, but the disclosure is not limited thereto. In some embodiments, the distance D1 between the bottom surface 142b of the second electrode 142 and the upper surface 110a of the substrate 110 may be not less than 2500 angstroms and not greater than 6000 angstroms. In some embodiments, a thickness T1 of the second electrode 142 may range from 200 angstroms to 800 angstroms, but the disclosure is not limited thereto. In some embodiments, a thickness T2 of the film layer 120 may be 5000 angstroms, but the disclosure is not limited thereto. For example, the distance D1 is the minimum distance measured between the bottom surface 142b of the second electrode 142 and the upper surface 110a of the substrate 110 along the normal direction Y. For example, the thickness T1 is the minimum distance of the second electrode 142 measured along the normal direction Y. For example, the thickness T2 is the minimum distance of the film layer 120 measured along the normal direction Y.

Moreover, referring to FIG. 1 again, in the embodiment, the transistor 150 is disposed on the substrate 110. The transistor 150 can include an active layer SE, a source SD, a drain SD1, a gate GE, and a part of a gate insulating layer GI. The active layer SE may be a semiconductor. The active layer SE is disposed on the insulating layer 130. The gate insulating layer GI is disposed on the active layer SE and the first electrode 141 and covers the insulating layer 130. The gate GE is disposed on the gate insulating layer GI corresponding to the active layer SE. Also, in some embodiments, the first electrode 141 of the capacitor 140 may be disposed on the same layer as the active layer SE. In some embodiments, the active layer SE and the first electrode 141 may be made of the same material, but the disclosure is not limited thereto. In some embodiments, the active layer SE may be disposed between the substrate 110 and the gate GE, but the disclosure is not limited thereto. In the embodiment, the material of the first electrode 141 and the material of the active layer SE includes amorphous silicon, polysilicon (e.g., low-temperature polysilicon (LTPS)), metal oxide (e.g., indium gallium zinc oxide (IGZO)), other suitable materials, or a combination thereof, but the disclosure is not limited thereto. In other embodiments, different transistors may include different semiconductor materials, but the disclosure is not limited thereto.

In some embodiments, the active layer SE in the transistor 150 is disposed on the insulating layer 130, and the second electrode 142 in the capacitor 140 is disposed under the insulating layer 130. In other words, the second electrode 142 is disposed under the active layer SE and is closer to the substrate 110 than the active layer SE. In some embodiments, the transistor 150 may include a light shielding layer (not shown) disposed under the active layer SE corresponding to the active layer SE. In some embodiments, the light shielding layer and the second electrode 142 can be the same layer. That is, a conductive layer is formed, and then the conductive layer is patterned to form the light shielding layer in the transistor 150 and the second electrode 142 in the capacitor 140.

In the embodiment, the electronic device 100 further includes a first insulating layer 170, a second insulating layer 171, a protection layer 172, and a planarization layer 173. The first insulating layer 170 is disposed on the gate GE and covers the gate insulating layer GI. The second insulating layer 171 is disposed on the first insulating layer 170. The source SD and the drain SD1 are respectively disposed on the second insulating layer 171. The source SD is electrically connected to the active layer SE through a first contact hole SD' penetrating the second insulating layer 171, the first insulating layer 170, and the gate insulating layer GI; and the drain SD1 is electrically connected to the active layer SE through a second contact hole SD1' penetrating the second insulating layer 171, the first insulating layer 170, and the gate insulating layer GI. The protection layer 172 is disposed on the source SD and the drain SD1 and covers the second insulating layer 171. The planarization layer 173 is disposed on the protection layer 172. In the embodiment, the material of the source SD and/or that of the drain SD1 may include transparent conductive materials or non-transparent conductive materials, such as indium tin oxide, indium zinc oxide, indium oxide, zinc oxide, tin oxide, metal materials (e.g., aluminum, molybdenum, copper, silver, etc.), other suitable materials, or a combination thereof, but the disclosure is not limited thereto. In the embodiment, the first insulating layer 170, the second insulating layer 171, the protection layer 172, and the planarization layer 173 may have a single-layer or multi-layer structure, and for example may include organic materials, inorganic materials, or a combination thereof, but the disclosure is not limited thereto.

Although in the electronic device 100 in the embodiment, the contour of the extension portion 111a of the protrusion 111 is arc-shaped or does not have an acute angle, the disclosure does not limit the shape of the contour of the extension portion 111a of the protrusion 111. That is, in some embodiments, the contour of the extension portion of the protrusion may also be taper-shaped or has an acute angle, as shown in FIG. 3A to FIG. 3I. In some embodiments, the contour of the extension portion of the protrusion may also be polygonal or irregular-shaped (not shown).

In the capacitor 140 of the electronic device 100 in the embodiment, the second electrode 142 is a conductive layer disposed between the film layer 120 and the insulating layer 130, and the first electrode 141 is a conductive layer disposed between the insulating layer 130 and the gate insulating layer GI and being the same layer as the active layer SE, but the disclosure does not limit the positions of the first electrode 141 and the second electrode 142 in the capacitor 140. That is, in some embodiments, the first electrode and the second electrode in the capacitor may also be conductive layers of other stacked layers in the electronic device, such as a metal layer, a semiconductor layer, or a transparent conductive layer (not shown). However, as long as the capacitor is adapted to stabilize the voltage difference, the disclosure is not limited thereto. For example, in a pixel structure corresponding to a mini LED served as a backlight module, a display device, or a splicing display device, the first electrode in the capacitor may be a metal layer disposed between the source/drain and the gate, and the second electrode may be a metal layer (not shown) in the same layer as the gate; in a pixel structure corresponding to a flexible liquid crystal display device, the first electrode in the capacitor may be a common electrode, and the second electrode may be a pixel electrode (not shown).

In short, in the capacitor 140 and the electronic device 100 with the capacitor 140 in the embodiment of the disclosure, the completed second electrode 142 of the capacitor 140 is electrically separated from the extension portion 111a of the protrusion 111 extending into the insulating layer 130 by disposing the second electrode 142 of the capacitor 140 between the film layer 120 and the insulating layer 130 (or by disposing the second electrode 142 of the capacitor 140 to be closer to the conductive layer of the substrate 110 than the active layer SE), and by disposing the first electrode 141 of the capacitor 140 on the same layer as the active layer SE (or by disposing the first electrode 141 of the capacitor 140 as a conductive layer that is the same layer as the active layer SE and is separated from the active layer SE). Since the second electrode 142 of the capacitor 140 is electrically separated from the extension portion 111a of the protrusion 111 extending into the insulating layer 130, the capacitor 140 is not short-circuited or fails due to the protrusion 111, and the capacitor 140 is still capable of operating effectively. In this way, the capacitor 140 and the electronic device 100 with the capacitor 140 in the embodiment of the disclosure have a better yield.

Other embodiments are illustrated below. Note that the following embodiments use the element numbers and part of the content thereof embodiments, wherein the same numbers are used to represent the same or similar elements, and the description of the same technical content is omitted. For the description of the omitted parts, refer to the foregoing embodiments, and the following embodiments will not be iterated.

FIG. 3A to FIG. 3H are schematic cross-sectional views of a manufacturing method of an electronic device according to another embodiment of the disclosure. FIG. 3I is a schematic three-dimensional view of the electronic device of FIG. 3H. Referring to FIG. 2A to FIG. 2I and FIG. 3A to FIG. 3I altogether, the electronic device 100a in the embodiment is substantially similar to the electronic device 100 of FIG. 2A to FIG. 2I, so the same and similar elements in the two embodiments are not iterated. The main difference between the electronic device 100a in the embodiment and the electronic device 100 is that the contour of the extension portion 111a' of the protrusion 111' in the embodiment is taper-shaped or has an acute angle.

Refer to FIG. 3A to FIG. 3H and FIG. 3I. The manufacturing method of the capacitor 140a in the electronic device 100a in the embodiment is illustrated below.

Figure 3A:
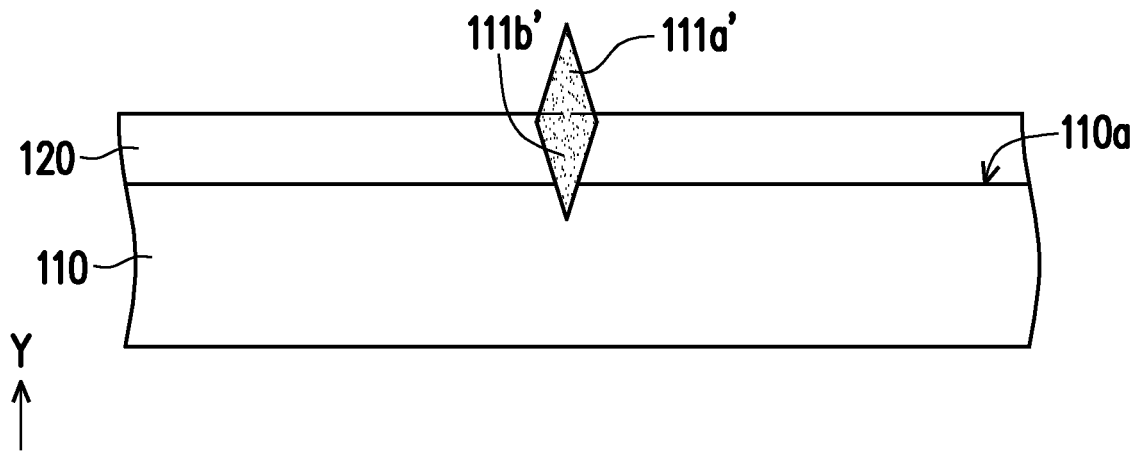
FIG. 3A to FIG. 3H are schematic cross-sectional views of a manufacturing method of an electronic device according to another embodiment of the disclosure.

First, referring to FIG. 3A, the film layer 120 is formed on the substrate 110 with a protrusion 111' so that the film layer 120 covers the upper surface 110a of the substrate 110 and the extension portion 111a' (upper part) of the protrusion 111' is exposed. Another part 111b' (lower part) of the protrusion 111' penetrates downward through the film layer 120 and is embedded in the substrate 110.

Figure 3B:
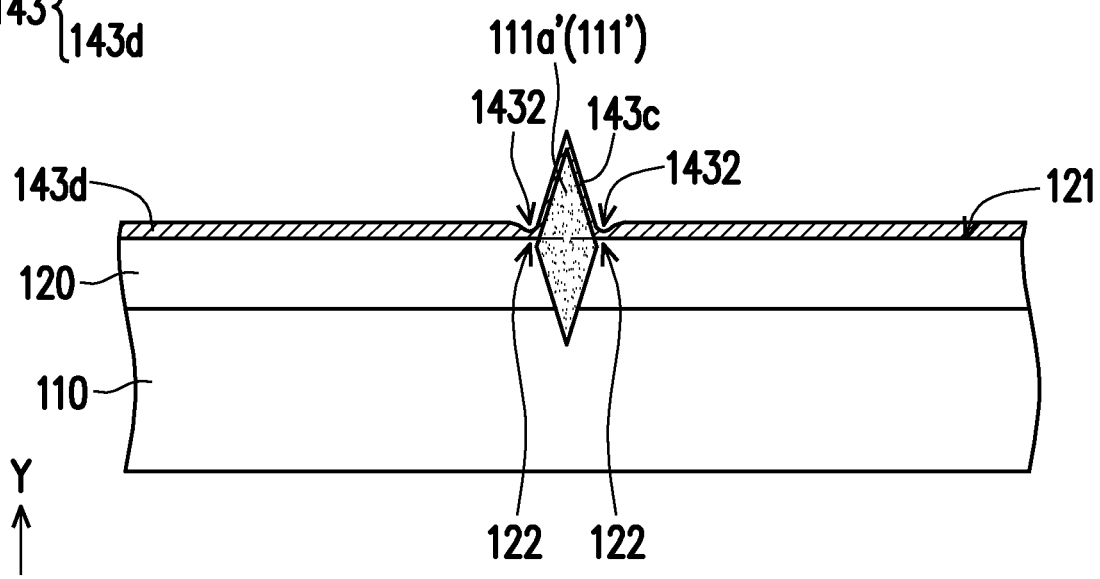

Next, referring to FIG. 3B, the electrode material layer 143 is formed on the surface 121 of the film layer 120 and on the extension portion 111a' of the protrusion 111'. In the embodiment, when the electrode material layer 143 is formed, since the contour of the extension portion 111a' of the protrusion 111' is taper-shaped or has an acute angle, the part 122 of the film layer 120 is not shielded and does not prevent the electrode material layer 143 from being deposited on the part 122 of the film layer 120, so that the deposited electrode material layer 143 is a continuous film layer and has a depression 1432. In detail, the depression 1432 is disposed corresponding to the part 122 of the film layer 120. The depression 1432 surrounds and is adjacent to the extension portion 111a' of the protrusion 111' to divide the electrode material layer 143 into a first section 143c, the depression 1432, and a second section 143d. The first section 143c is disposed on the extension portion 111a' of the protrusion 111', the second section 143d is disposed on the surface 121 of the film layer 120, and the first section 143c and the second section 143d are connected to each other. In addition, compared to the thickness of the second section 143d, the thickness of the first section 143c is less, but the disclosure is not limited thereto.

Figure 3C:
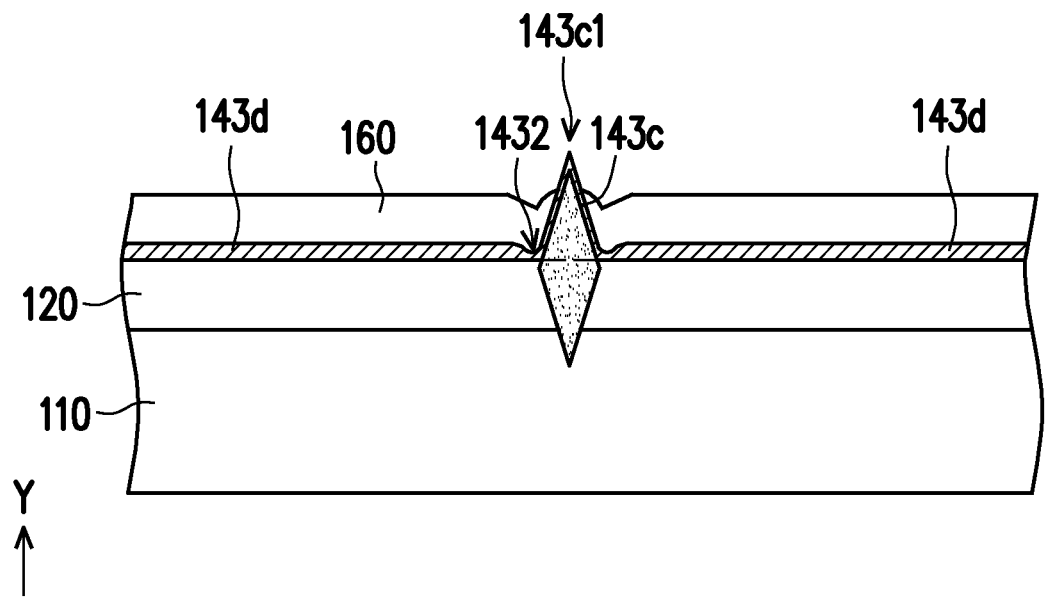

Furthermore, refer to FIG. 3C, the photoresist layer 160 is formed on the electrode material layer 143 so that the photoresist layer 160 covers the first section 143c, the depression 1432, and the second section 143d of the electrode material layer 143; and a top 143c1 (i.e., a tip corresponding to the extension portion 111a' of the protrusion 111') of the first section 143c is exposed. Compared to the thickness of the photoresist layer 160 covering the second section 143d, the thickness of the photoresist layer 160 covering the first section 143c is less, but the disclosure is not limited thereto.

Figure 3D:
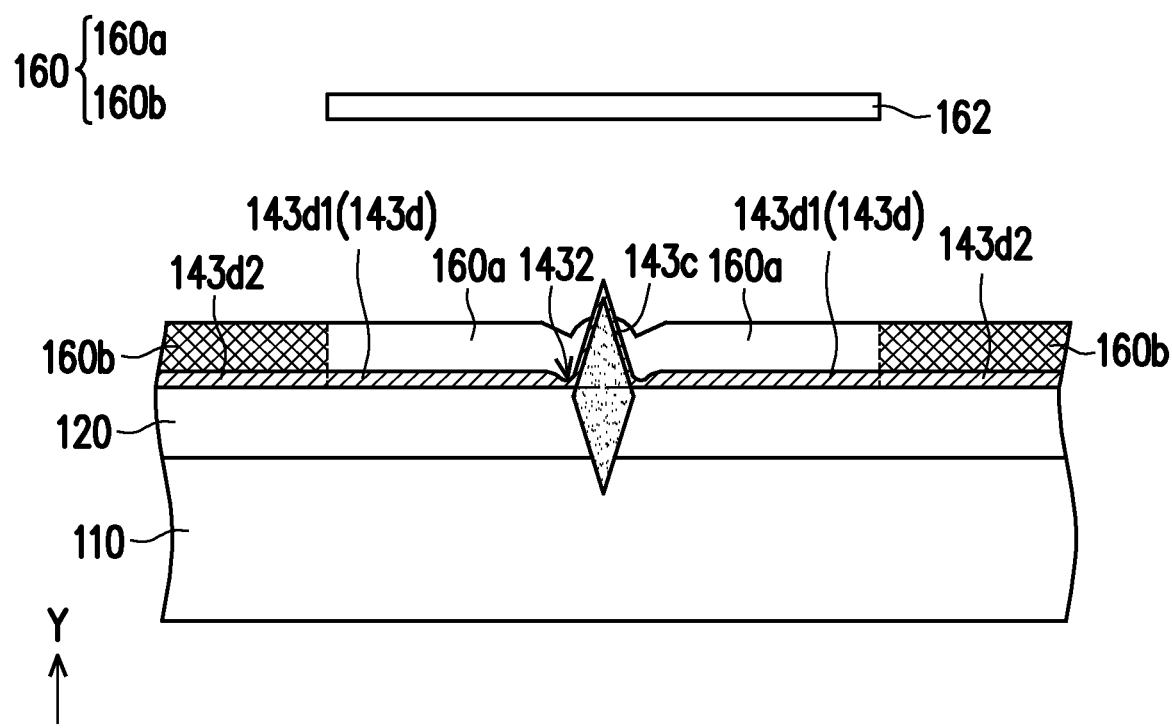

Then, referring to FIG. 3D, after the photomask 162 is disposed to shield the photoresist layer 160 (i.e., the photoresist layer 160a) on the first section 143c, the depression 1432, and the part 143d1 of the second section 143d of the electrode material layer 143, the exposure process (e.g., ultraviolet light is used for irradiation, but the disclosure is not limited thereto) is performed on the photoresist layer 160, so that the photoresist layer 160 (i.e., the photoresist layer 160b) not shielded by the photomask 162 is denatured.

Figure 3E:
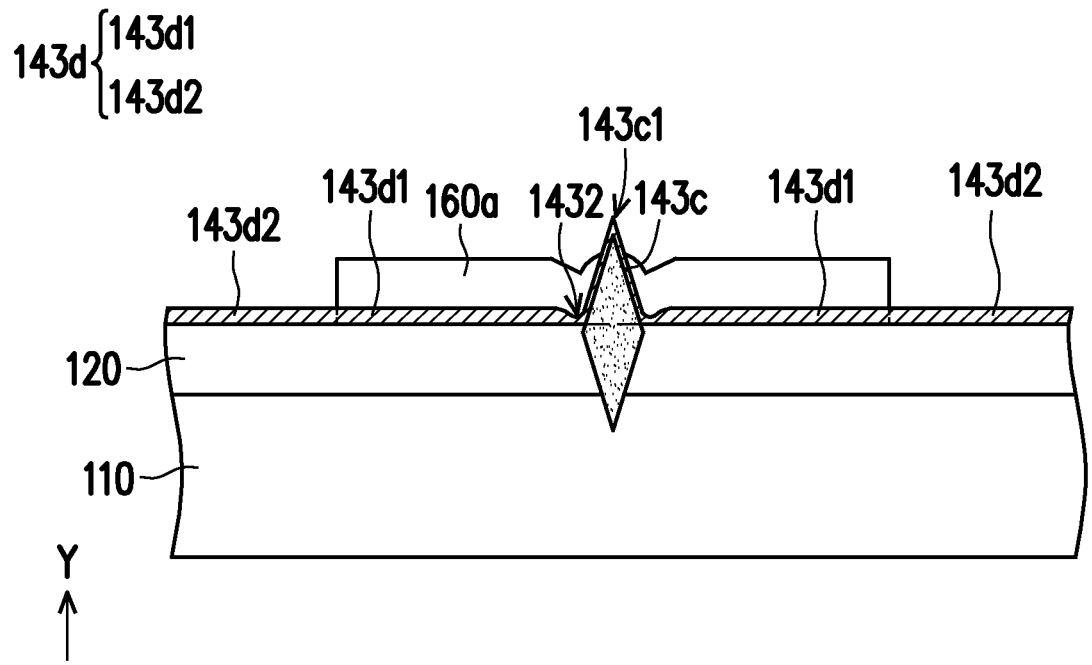

Then, referring to FIG. 3E, the developing process is performed on the photoresist layers 160a and 160b to remove the denatured photoresist layer 160b, and another part 143d2 of the second section 143d of the electrode material layer 143 is exposed.

Figure 3F:
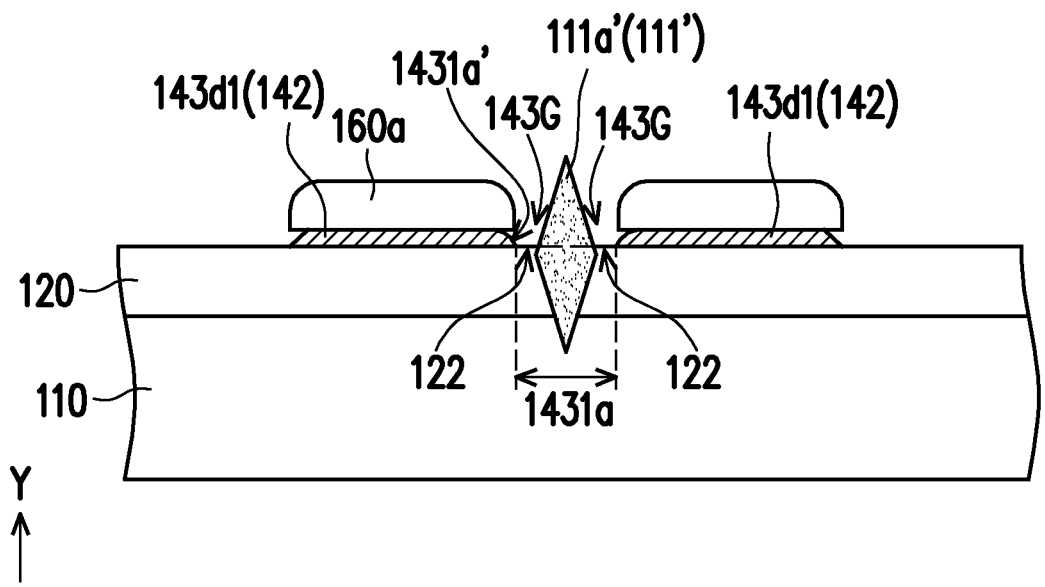

Next, referring to FIG. 3F, the etching process is performed to remove another part 143d2 of the second section 143d of the electrode material layer 143 exposed by the photoresist layer 160a. In addition, since the top 143c1 of the first section 143c is further exposed by the photoresist layer 160a, the top 143c1 of the first section 143c is further removed during the etching process; and the rest of the first section 143c, the depression 1432, and the part of the photoresist layer 160a on the first section 143c and the depression 1432 are removed. In this way, after the electrode material layer 143 is subjected to the etching process, the part 143d1 of the second section 143d, i.e., the required part of the second electrode 142, remains. In this way, the second electrode 142 has an opening 1431a, and the protrusion 111' is disposed in the opening 1431a. Furthermore, after etching, the gap 143G is formed between the protrusion 111' and the second electrode 142.

Figure 3G:
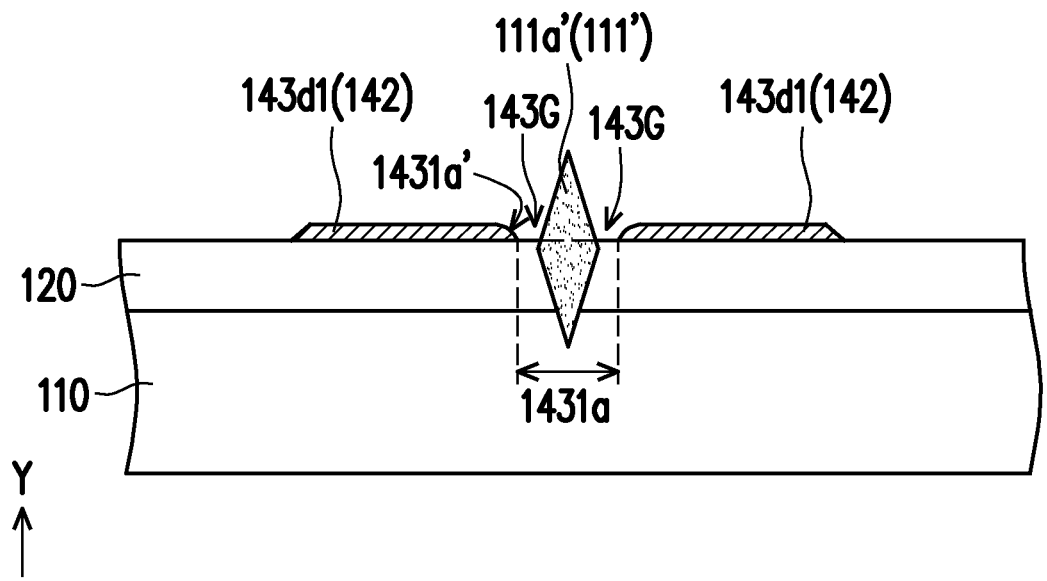

Then, referring to FIG. 3G, the remained photoresist layer 160a is removed, and the part 143d1 of the second section 143*d* of the electrode material layer 143 is exposed to form the second electrode 142. The second electrode 142 includes the part 143*d*1 of the second section 143*d* of the electrode material layer 143.

Figure 3H:
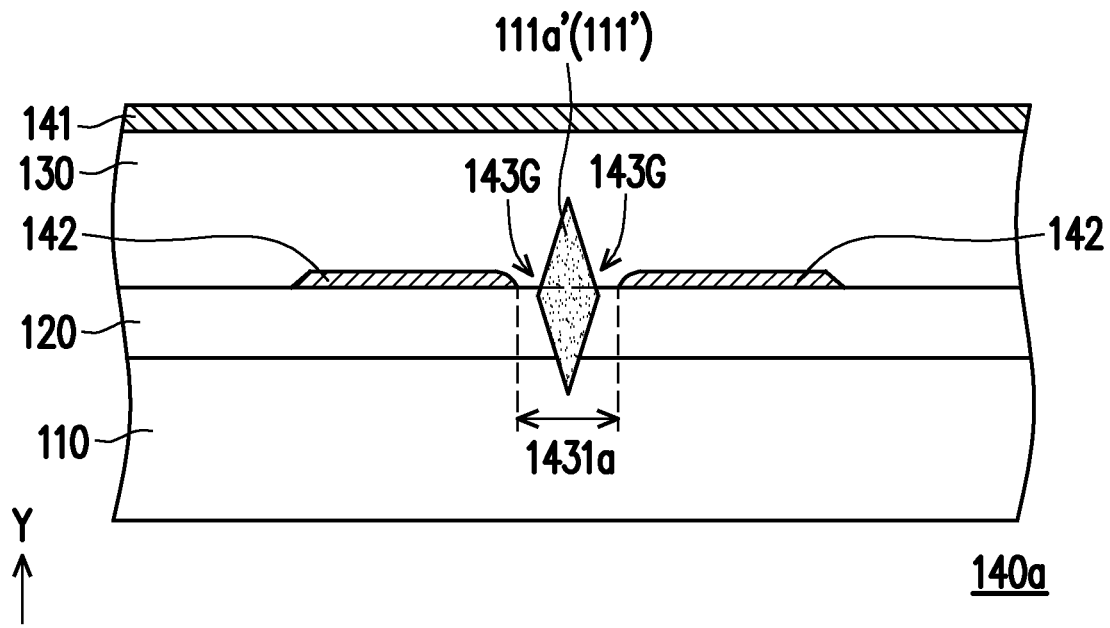
Figure 3I:
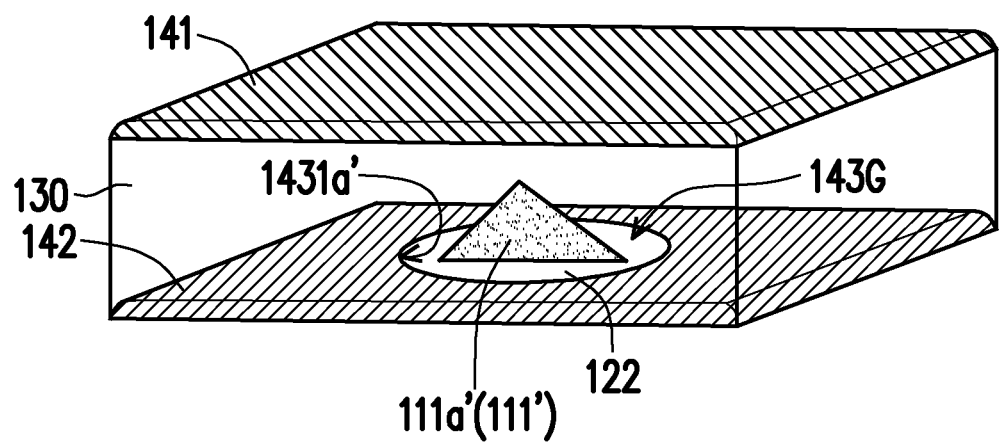
FIG. 3I is a schematic three-dimensional view of the electronic device of FIG. 3H.

Finally, referring to FIGS. 3H and 3I, the insulating layer 130 is first formed on the second electrode 142 so that the insulating layer 130 covers the film layer 120 and the second electrode 142, and the insulating layer 130 is filled in the gap 143G. Next, the first electrode 141 is formed on the insulating layer 130 to complete the capacitor 140*a* in the embodiment. As shown in FIG. 3H, in the capacitor 140, the gap 143G exists between the extension portion 111*a*' of the protrusion 111' and the second electrode 142, and the insulating layer 130 is filled in the gap 143G. In this way, the extension portion 111*a*' of the protrusion 111' is electrically separated from the second electrode 142 through the gap 143G. In this way, the conductive protrusion 111' and the second electrode 142 are prevented from being short-circuited and causing the capacitor 140 to fail.

According to some embodiments, to verify whether a product has the capacitor 140*a* disclosed in the disclosure, it may be learned from the pattern of the second electrode 142 in the capacitor 140*a*. Specifically, for example, as shown in FIG. 3H, an electron microscope or an X-ray analyzer is adapted to observe the position of the capacitor 140*a* in the normal direction Y from the lower surface 110*b* of the substrate 110. If the orthographic projection of the opening on the relative position of the second electrode 142 of the capacitor 140*a* is observed, it is learned that the orthographic projection of the opening is the opening 1431*a* of the second electrode 142. That is, it can be proved that the product has the characteristics of the capacitor in accordance with the disclosure. The observed orthographic projection of the opening may be circular, oval, or polygonal, but it is not limited thereto, and it may be in other shapes.

Based on the above, in the capacitor and the electronic device with the capacitor in the embodiments of the disclosure, the capacitor is disposed on a substrate with a protrusion. The protrusion penetrates the second electrode to form a gap and extends into an insulating layer. The protrusion is electrically separated from the second electrode through the gap. In this way, the conductive protrusion and the second electrode are prevented from being short-circuited and causing the capacitor to fail. In this way, the capacitor is still capable of operating effectively, and the capacitor and the electronic device with the capacitor in the embodiments of the disclosure have a better yield.

It should be finally noted that the above embodiments are merely intended for describing the technical solutions of the present disclosure rather than limiting the present disclosure. The features of the embodiments may be used in any combination without departing from the spirit of the present disclosure or conflicting with each other. Although the present disclosure is described in detail with reference to the foregoing embodiments, those of ordinary skill in the art should understand that they can still make modifications to the technical solutions described in the foregoing embodiments or make equivalent substitutions to some or all technical features thereof, without departing from scope of the technical solutions of the embodiments of the present disclosure.

What is claimed is:

1. A capacitor, disposed on a substrate with a protrusion and comprising:
    a first electrode disposed on the protrusion and comprising a first voltage;
    a second electrode comprising a second voltage different from the first voltage and being closer to the substrate than the first electrode; and
    an insulating layer disposed on the protrusion and between the first electrode and the second electrode, wherein the first electrode is disposed on the insulating layer,
    wherein the protrusion penetrates the second electrode and extends into the insulating layer wherein the protrusion comprises an extension portion extending into the insulating layer and electrically separated from the second electrode.

2. The capacitor according to claim 1, wherein a gap exists between the extension portion of the protrusion and the second electrode, and the insulating layer is filled in the gap.

3. The capacitor according to claim 1, wherein the insulating layer covers the extension portion of the protrusion.

4. The capacitor according to claim 1, wherein a contour of the extension portion of the protrusion is arc-shaped or taper-shaped.

5. The capacitor according to claim 1, wherein the capacitor comprises a residual electrode portion disposed on a top of the protrusion, and the residual electrode portion and the second electrode are made of a same material.

6. The capacitor according to claim 5, wherein the residual electrode portion is electrically separated from the second electrode.

7. The capacitor according to claim 5, wherein the second electrode comprises an opening, and the protrusion is disposed in the opening.

8. The capacitor according to claim 7, an orthographic projection of the extension portion of the protrusion in a normal direction on the substrate at least partially overlaps an orthographic projection of the opening in the normal direction on the substrate.

9. The capacitor according to claim 8, wherein an orthographic projection of the residual electrode portion in a normal direction on the substrate at least partially overlaps the orthographic projection of the opening in the normal direction on the substrate.

10. The capacitor according to claim 9, wherein the orthographic projection of the residual electrode portion in the normal direction on the substrate is less than an orthographic projection of the opening in the normal direction on the substrate.

11. The capacitor according to claim 1, wherein the capacitor is disposed on the substrate via a film layer.

12. The capacitor according to claim 11, wherein a distance between the second electrode and the substrate is not less than 1500 angstroms and not greater than 7000 angstroms.

13. The capacitor according to claim 12, wherein the distance is not less than 2500 angstroms and not greater than 6000 angstroms.

14. The capacitor according to claim 11, wherein the film layer is disposed between the insulating layer and the substrate.

15. The capacitor according to claim 11, wherein the protrusion penetrates the film layer and is exposed outside the film layer.

16. An electronic device, comprising the capacitor of claim 1.

17. The electronic device according to claim 16, wherein the electronic device is a display device.

18. The electronic device according to claim 16, wherein the electronic device comprises the substrate and a transistor, the transistor is disposed on the substrate, the transistor comprises an active layer, and the active layer and the first electrode are made of a same material.

19. The electronic device according to claim 18, wherein the first electrode of the capacitor and the active layer are a same layer.

* * * * *